United States Patent
Tan et al.

(10) Patent No.: US 9,767,991 B2
(45) Date of Patent: Sep. 19, 2017

(54) METHODS AND SYSTEMS FOR INDEPENDENT CONTROL OF RADICAL DENSITY, ION DENSITY, AND ION ENERGY IN PULSED PLASMA SEMICONDUCTOR DEVICE FABRICATION

(71) Applicant: Lam Research Corporation, Fremont, CA (US)

(72) Inventors: Zhongkui Tan, San Jose, CA (US); Qian Fu, Pleasanton, CA (US); Ying Wu, Dublin, CA (US); Qing Xu, Fremont, CA (US)

(73) Assignee: Lam Research Corporation, Fremont, CA (US)

(*) Notice: Subject to any disclaimer, the term of this patent is extended or adjusted under 35 U.S.C. 154(b) by 0 days.

(21) Appl. No.: 14/932,416

(22) Filed: Nov. 4, 2015

(65) Prior Publication Data
US 2017/0125216 A1    May 4, 2017

(51) Int. Cl.
*H01L 21/306* (2006.01)
*H01J 37/32* (2006.01)
*H01L 21/3065* (2006.01)
*H01L 21/308* (2006.01)

(52) U.S. Cl.
CPC ...... *H01J 37/32146* (2013.01); *H01L 21/308* (2013.01); *H01L 21/3065* (2013.01); *H01J 2237/0656* (2013.01); *H01J 2237/334* (2013.01)

(58) Field of Classification Search
CPC ..................... H01L 21/3065; H01L 21/308
See application file for complete search history.

(56) References Cited

U.S. PATENT DOCUMENTS

2011/0309049 A1* 12/2011 Papasouliotis .... H01J 37/32146
216/37

OTHER PUBLICATIONS

S. Wolf and R.N. Tauber, (Silicon Processing for the VLSI Era, vol. 1—Process Technology, Lattice Press, 1986) (pp. 542-557).*

* cited by examiner

*Primary Examiner* — Duy Deo
*Assistant Examiner* — Mahmoud Dahimene
(74) *Attorney, Agent, or Firm* — Martine Penilla Group, LLP

(57) ABSTRACT

For a first period of time, a higher radiofrequency power is applied to generate a plasma in exposure to a substrate, while applying low bias voltage at the substrate level. For a second period of time, a lower radiofrequency power is applied to generate the plasma, while applying high bias voltage at the substrate level. The first and second periods of time are repeated in an alternating and successive manner for an overall period of time necessary to produce a desired effect on the substrate. In some embodiments, the first period of time is shorter than the second period of time such that on a time-averaged basis the plasma has a greater ion density than radical density. In some embodiments, the first period of time is greater than the second period of time such that on a time-averaged basis the plasma has a lower ion density than radical density.

18 Claims, 5 Drawing Sheets

METHODS AND SYSTEMS FOR INDEPENDENT CONTROL OF RADICAL DENSITY, ION DENSITY, AND ION ENERGY IN PULSED PLASMA SEMICONDUCTOR DEVICE FABRICATION

BACKGROUND

1. Field of the Invention

The present invention relates to semiconductor device fabrication.

2. Description of the Related Art

Many modern semiconductor chip fabrication processes include generation of a plasma from which ions and/or radical constituents are derived for use in either directly or indirectly affecting a change on a surface of a substrate exposed to the plasma. For example, various plasma-based processes can be used to etch material from a substrate surface, deposit material onto a substrate surface, or modify a material already present on a substrate surface. The plasma is often generated by applying radiofrequency (RF) power to a process gas in a controlled environment, such that the process gas becomes energized and transforms into the desired plasma. The characteristics of the plasma are affected by many process parameters including, but not limited to, material composition of the process gas, flow rate of the process gas, geometric features of the plasma generation region and surrounding structures, temperatures of the process gas and surrounding materials, frequency and magnitude of the RF power applied, and bias voltage applied to attract charged constituents of the plasma toward the substrate, among others. It is of interest to understand and control some of the process parameters that may affect how the generated plasma interacts with the substrate. It is within this context that the present invention arises.

SUMMARY

In one example embodiment, a method is disclosed for controlling a plasma in a semiconductor fabrication process to have an increased ion density and a decreased radical density. The method includes an operation (a) for disposing a substrate on a substrate holder within a process module. The method includes an operation (b) for supplying a process gas composition to a plasma generation region overlying the substrate. The method includes an operation (c) in which, for a first period of time, a first radiofrequency power is applied to the process gas composition within the plasma generation region to generate a plasma in exposure to the substrate. The first radiofrequency power corresponds to a high radiofrequency power level. Also, during the operation (c), bias voltage is applied at the substrate holder at a first bias voltage setting corresponding to a low bias voltage level. The method also includes an operation (d) in which, for a second period of time, after completion of the first period of time, a second radiofrequency power is applied to the process gas composition within the plasma generation region to generate the plasma in exposure to the substrate. The second radiofrequency power is applied instead of the first radiofrequency power. The second radiofrequency power corresponds to a low radiofrequency power level. Also, during the operation (d), bias voltage is applied at the substrate holder at a second bias voltage setting corresponding to a high bias voltage level. The method includes repeating operations (c) and (d) in an alternating and successive manner for an overall period of time necessary to produce a desired effect on the substrate. In the method, a duration of the first period of time of operation (c) is shorter than a duration of the second period of time of operation (d) such that a time-averaged ion density within the plasma is greater than a time-averaged radical density within the plasma.

In one example embodiment, a method is disclosed for controlling a plasma in a semiconductor fabrication process to have a decreased ion density and an increased radical density. The method includes an operation (a) for disposing a substrate on a substrate holder within a process module. The method also includes an operation (b) for supplying a process gas composition to a plasma generation region overlying the substrate. The method also includes an operation (c) in which, for a first period of time, a first radiofrequency power is applied to the process gas composition within the plasma generation region to generate a plasma in exposure to the substrate. The first radiofrequency power corresponds to a high radiofrequency power level. Also, during the operation (c), bias voltage is applied at the substrate holder at a first bias voltage setting corresponding to a low bias voltage level. The method also includes an operation (d) in which, for a second period of time, after completion of the first period of time, a second radiofrequency power is applied to the process gas composition within the plasma generation region to generate the plasma in exposure to the substrate. The second radiofrequency power is applied instead of the first radiofrequency power. The second radiofrequency power corresponds to a low radiofrequency power level. Also, during the operation (d), bias voltage is applied at the substrate holder at a second bias voltage setting corresponding to a high bias voltage level. The method includes repeating operations (c) and (d) in an alternating and successive manner for an overall period of time necessary to produce a desired effect on the substrate. In the method, a duration of the first period of time of operation (c) is greater than a duration of the second period of time of operation (d) such that a time-averaged ion density within the plasma is less than a time-averaged radical density within the plasma.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Methods and systems are disclosed herein for providing independent control of radical density, ion density, and ion energy in pulsed plasma processing of a substrate in a semiconductor device fabrication process. In various embodiments, the methods disclosed herein for pulsed plasma processing of the substrate can be performed to selectively remove/etch material from the substrate, and/or deposit material on the substrate, and/or clean/ash a particular material from the substrate, among others. In an example embodiment, the term substrate as used herein refers to a semiconductor wafer. However, it should be understood that in other embodiments, the term substrate as used herein can refer to substrates formed of sapphire, GaN, GaAs or SiC, or other substrate materials, and can include glass panels/substrates, metal foils, metal sheets, polymer materials, or the like. Also, in various embodiments, the substrate as referred to herein may vary in form, shape, and/or size. For example, in some embodiments, the substrate as referred to herein may correspond to a 200 mm (millimeters) semiconductor wafer, a 300 mm semiconductor wafer, or a 450 mm semiconductor wafer. Also, in some embodiments, the substrate as referred to herein may correspond to a non-circular substrate, such as a rectangular substrate for a flat panel display, or the like, among other shapes.

Figure 1:
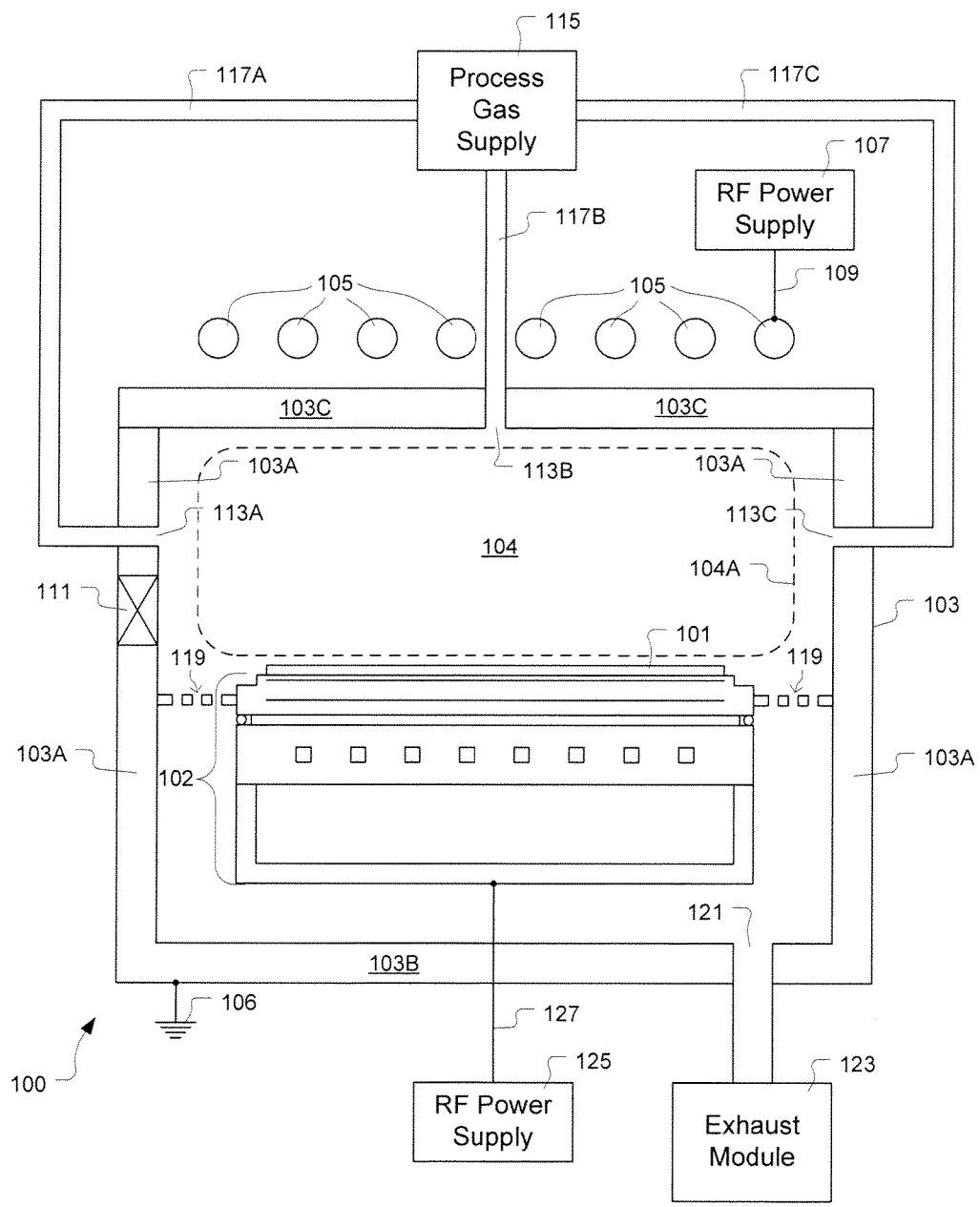
FIG. 1 shows an example substrate process module, in accordance with various embodiments of the present invention.

FIG. 1 shows an example substrate process module 100, in accordance with various embodiments of the present invention. The process module 100 includes a substrate holder 102 configured to hold the substrate 101 in exposure to a plasma generation region 104A in which a plasma 104 is generated. The present disclosure primarily concerns methods and systems by which process parameters of primary plasma power and bias voltage are systematically controlled to provide for control of time-averaged ion density within the plasma 104 relative to time-averaged radical density within the plasma 104. To provide example context, the process module 100 is depicted as an inductively coupled plasma (ICP) process module. However, it should be understood that in other embodiments the process module 100 can be defined as other types of process modules used in semiconductor fabrication.

The process module 100 is configured to provide for exposure of the substrate 101 to a plasma-based processing operation in order to modify characteristics of the substrate 101 in a prescribed and controlled manner. The process module 100 includes a chamber 103 defined by surrounding structures, including one or more wall structures 103A, a bottom structure 103B, and a top structure 103C. In some embodiments, the top structure 103C is formed of a material through which RF signals can be transmitted, such as quartz or ceramic, among others. The chamber 103 can be formed of an electrically conductive material and have an electrical connection to a reference ground potential 106.

The process module 100 includes a coil assembly 105 disposed above the top structure 103C. An RF power supply 107 is connected to supply RF power (RF signals) to the coil assembly 105 through a connection 109. The RF power supplied to the coil assembly 105 is referred to as primary plasma power herein. In various embodiments, the primary plasma power can extend up to about 6000 Watts (W), or even higher. In various embodiments, the RF power supply 107 includes one or more RF generators and associated impedance matching circuitry to provide for proper transmission of the RF power to coil assembly 105.

In various embodiments, the RF power supply 107 can include one or more RF signal generators operating at one or more frequencies. Multiple RF signal frequencies can be supplied to the coil assembly 105 at the same time. In some embodiments, signal frequencies output by the RF power supply 107 are set within a range extending from 1 kHz (kiloHertz) to 100 MHz (megaHertz). In some embodiments, signal frequencies output by the RF power supply 107 are set within a range extending from 400 kHz to 60 MHz. In some embodiments, the RF power supply 107 is set to generate RF signals at frequencies of 2 MHz, 27 MHz, and 60 MHz. In some embodiments, the RF power supply 107 is set to generate one or more high frequency RF signals within a frequency range extending from about 1 MHz to about 60 MHz, and generate one or more low frequency RF signals within a frequency range extending from about 100 kHz to about 1 MHz. It should be understood that the above-mentioned RF signal frequency ranges are provided by way of example. In practice, the RF power supply 107 can be configured to generate essentially any RF signal having essentially any frequency as needed to generate the plasma 104 within the plasma generation region 104A. Additionally, the RF power supply 107 can include frequency-based filtering, i.e., high-pass filtering and/or low-pass filtering, to ensure that specified RF signal frequencies are transmitted to the coil assembly 105.

In some embodiments, the process module 100 includes a closable access port 111, such as a gate valve or other component, through which the substrate 101 can be transferred into and out of the chamber 103. The process module 100 also includes a number of process gas supply ports 113A, 113B, 113C through which one or more process gas composition(s) can be supplied to the interior region of the chamber 103 overlying the substrate holder 102. During operation, a process gas supply 115 operates to deliver the one or more process gas composition(s) through one or more connection lines 117A, 117B, 117C to the process gas supply ports 113A, 113B, 113C, respectively, and RF power is delivered from the RF power supply 107 to the coil assembly 105, such that the RF power generates an electromagnetic field within a plasma generation region below the top structure 103C and overlying the substrate holder 102 so as to transform the one or more process gas composition(s) within the plasma generation region 104A into the plasma 104. Then, reactive constituents of the plasma 104, such as ions and/or radicals, interact with portions of the exposed surfaces of the substrate 101. The process module 100 includes a number of side vent structures 119 through which gases and by-product materials can flow to an exhaust port 121, which is connected to an exhaust module 123 configured to apply a negative pressure to the interior of the chamber 103 to facilitate exhaust of the used process gases and by-product materials.

Also, in some embodiments, the substrate holder 102 is configured to receive bias RF power from a bias RF power supply 125 through a connection 127 to provide for generation of a bias voltage on the substrate holder 102 in order to attract ions from the plasma 104 toward the substrate holder 102 and substrate 101 held thereon. In various embodiments, the bias voltage generated on the substrate holder 102 can extend up to 5000 Volts (V), or even higher. In various embodiments, the RF power supply 125 includes one or more RF generators and associated impedance matching circuitry to provide for proper transmission of the RF power to substrate holder 102.

In various embodiments, the RF power supply 125 can include one or more RF signal generators operating at one or more frequencies. Multiple RF signal frequencies can be supplied to the substrate holder 102 at the same time. In some embodiments, signal frequencies output by the RF power supply 125 are set within a range extending from 1 kHz (kiloHertz) to 100 MHz (megaHertz). In some embodiments, signal frequencies output by the RF power supply 125 are set within a range extending from 400 kHz to 60 MHz. In some embodiments, the RF power supply 125 is set to generate RF signals at frequencies of 2 MHz, 27 MHz, and 60 MHz. In some embodiments, the RF power supply 125 is set to generate one or more high frequency RF signals within a frequency range extending from about 1 MHz to about 60 MHz, and generate one or more low frequency RF signals within a frequency range extending from about 100 kHz to about 1 MHz. It should be understood that the above-mentioned RF signal frequency ranges are provided by way of example. In practice, the RF power supply 125 can be configured to generate essentially any RF signal having essentially any frequency as needed to generate a prescribed bias voltage at the substrate 101. Additionally, the RF power supply 125 can include frequency-based filtering, i.e., high-pass filtering and/or low-pass filtering, to ensure that specified RF signal frequencies are transmitted to the substrate holder 102.

Although the process module 100 depicts an example of an ICP process module, in various embodiments, the process module 100 can be essentially any type of process module used in semiconductor device fabrication. For example, in some embodiments, the process module 100 can be a capacitively coupled plasma (CCP) process module in which, instead of the coil assembly 105 used in the ICP process module, the CCP process module includes one or more electrodes disposed within the chamber 103, with RF power delivered to the one or more electrodes. In the CCP process module, the one or more electrodes can include one or more of a top electrode (e.g., a showerhead electrode or solid electrode, among others), a bottom electrode (e.g., an electrostatic chuck or substrate support, among others), and a side electrode (e.g., a peripheral ring-shaped electrode, among others), where the top, bottom, and side electrodes are configured around the plasma generation region. The RF power delivered to the one or more electrodes of the CCP process module is transmitted from the one or more electrodes through the one or more process gas composition(s) present within the plasma generation region to a reference ground potential, and in doing so transforms the one or more process gas composition(s) within the plasma generation region 104A into the plasma 104. Therefore, the RF power delivered to the one or more electrodes of the CCP process module is the primary plasma power as referred to herein.

It should be understood that the ICP and CCP process module examples mentioned above are discussed in a simplified manner for ease of description. In reality, the process module 100, whether ICP, CCP, or some other type, is a complex system that includes many components not described herein. However, what should be appreciated for the present discussion is that the process module 100, regardless of type, includes the substrate holder 102 configured to hold the substrate 101 in a secured manner in exposure to the plasma 104 to enable processing of the substrate 101 to obtain a specific result. Examples of plasma processing operations that may performed by the process module 100 include etching operations, deposition operations, and ashing operations, among others.

In plasma processing of substrates for semiconductor fabrication, it is often beneficial/necessary to control ion and radical behavior within the plasma and at the substrate level. In plasma processing methods, generation of the ion density within the plasma and the radical density within the plasma are coupled together due to the fact that they each have a direct correlation with the level of RF power (primary plasma power) applied to generate the plasma. More specifically, in conventional plasma processing methods, such as plasma etching, the radical density and the ion density within the plasma are both controlled by electron density and electron temperature within the plasma, and hence, controlled by the primary plasma power. As a result, when the RF power applied to generate the plasma is increased, both the ion density within the plasma and the radical density within the plasma increase in a simultaneous manner. And, when the RF power applied to generate the plasma is decreased, both the ion density within the plasma and the radical density within the plasma decrease in a simultaneous manner. In view of the foregoing, conventional plasma processing methods do not provide for independent control of the ion density within the plasma relative to the radical density within the plasma, and this leads to some fundamental limitations on control of the plasma processing of the substrate.

For example, in some applications, radicals are used for deposition to protect a mask material, and high energy ions are used for etching of a target material exposed through an opening in the overlying mask material. Due to the aforementioned coupling of ion density and radical density within the plasma, when the primary plasma power is increased in order to increase the radical density so as to repair/rebuild mask material through deposition, the ion density is also increased which causes an increase in loss of mask material, thereby working against the effort to repair/rebuild the mask material. Therefore, the etching selectivity of target material relative to mask material is often lower when the primary plasma power is higher.

Also, in some cases, a ratio of radical density-to-ion density within the plasma can be used to provide improved etch profile control. However, with conventional plasma processing methods, the process gas composition chemistry has to be changed in order to obtain a change in the ratio of radical density-to-ion density within the plasma. That is to say, in conventional plasma processing methods using a given process gas composition chemistry, it is not possible to change the radical density within the plasma without also changing the ion density within the plasma, vice-versa. And, having to change between different process gas compositions during plasma processing operations takes time and can adversely impact the overall fabrication throughput. Therefore, various types of etch profile control applied in conventional plasma processing methods yields a mixed/collective effect on radical density and ion density within the plasma. Given the foregoing, it should be appreciated that conventional plasma processing methods often include some type of trade-off between etch profile control, mask selectivity, and overall fabrication throughput.

The methods and systems disclosed herein provide for effective independent control of radical density, ion density, and ion energy during plasma processing of a substrate. The methods disclosed herein exploit the difference between the mean-lifetime of the ions within the plasma and the mean-lifetime of the radicals within the plasma. When the primary plasma power is decreased, the ion density within the plasma will drop much faster, e.g., several orders of magnitude faster, than the radical density within the plasma. For example, in a pulsed plasma where the primary plasma power is raised and lowered in a cyclical manner with an appropriate cycle frequency, if the pulse cycle includes a fast pulse portion at a higher primary plasma power level and a following pulse portion at a lower primary plasma power level, the ion density within the plasma will rapidly decay to a lower level so as to follow the change in primary plasma power, but the radical density within the plasma will decay slowly and will not have sufficient time to follow the change in the primary plasma power before the primary plasma power goes high again with the next cycle.

In the methods disclosed herein, the primary plasma power is pulsed/cycled in a dual-level manner, i.e., pulsed/cycled between a higher primary plasma and a lower primary plasma power. In this manner, the radical density within the plasma is set by the time-averaged primary plasma power. Also, in the methods disclosed herein, a bias voltage applied at the substrate level is pulsed/cycled in a dual-level manner in a reverse synchronous relationship with the dual-level pulsing/cycling of the primary plasma power. In this manner, the ion density within the plasma at the substrate level is controlled by the applied primary plasma power when the bias voltage is on/applied at the substrate level, and the ion energy is controlled by the level of bias voltage that is applied at the substrate level. The ion density when the bias voltage is off is insignificant with regard to etch results, because when the bias voltage is off the ion energy is close to zero and the ion density is a few orders of magnitude less than the radical density. Therefore with no bias voltage applied, plasma behavior is dominated by radical density. It should be understood that the ion effects manifest when the bias voltage is on/applied, and not when the bias voltage is off. So, ion density is controlled by the primary plasma power level that exists when the bias voltage is on/applied, while radical density is controlled by the time-averaged primary plasma power. Therefore, with appropriate pulsing/cycling of the primary plasma power in conjunction with appropriate pulsing/cycling of the bias voltage in a reversed synchronized manner relative to the primary plasma power, it is possible to obtain effectively independent control of radical density, ion density, and ion energy in the plasma process.

Figure 2A:
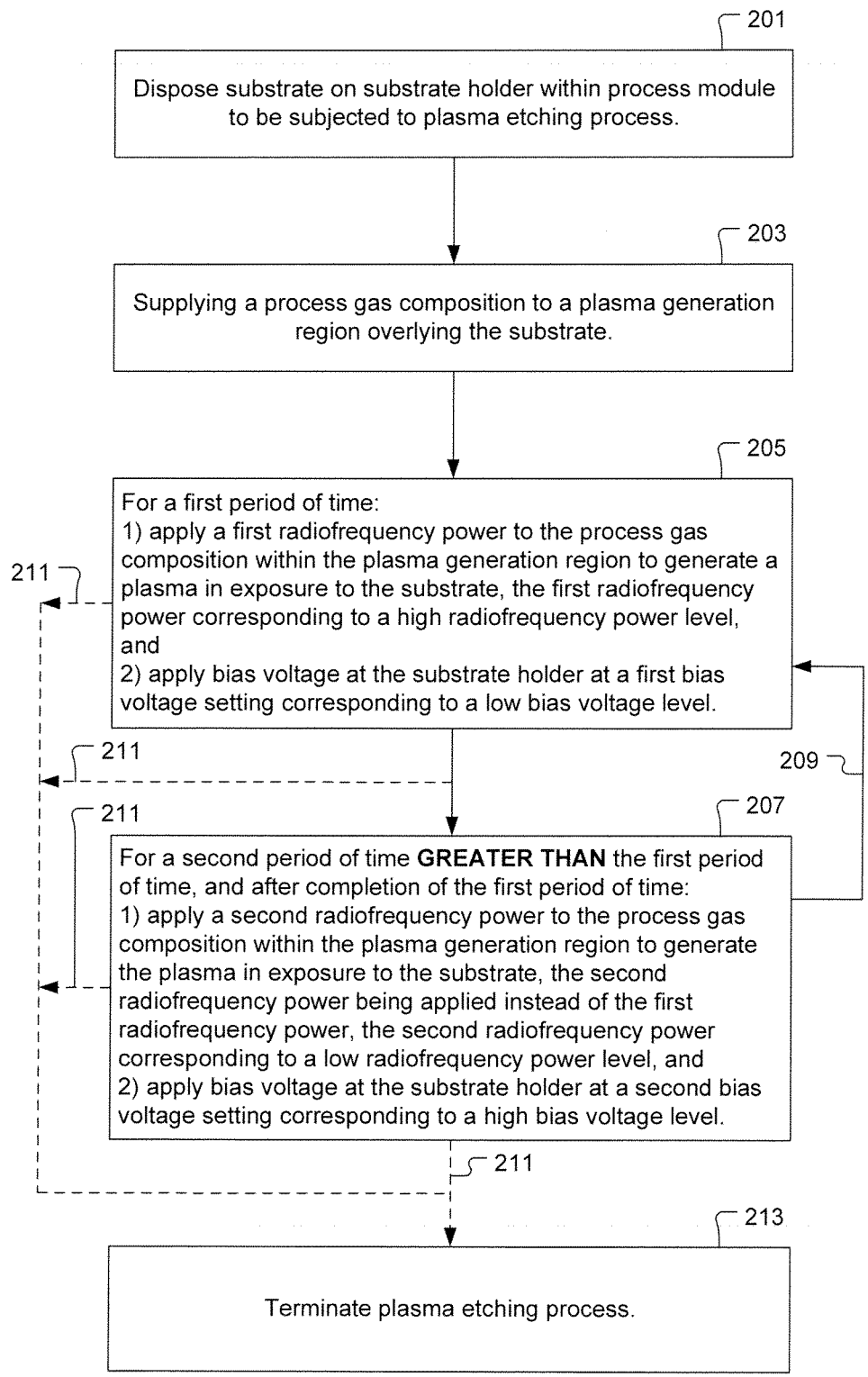
FIG. 2A shows a flowchart for a method for controlling a plasma in a semiconductor fabrication process to have an increased ion density and a decreased radical density, in accordance with some embodiments of the present invention.

FIG. 2A shows a flowchart for a method for controlling a plasma in a semiconductor fabrication process to have an increased ion density and a decreased radical density, in accordance with some embodiments of the present invention. The method includes an operation 201 for disposing a substrate (101) on a substrate holder (102) within a process module (100). The method also includes an operation 203 for supplying a process gas composition to a plasma generation region (104A) overlying the substrate (101). The method also includes an operation 205 in which, for a first period of time, a first radiofrequency power is applied to the process gas composition within the plasma generation region (104A) to generate a plasma (104) in exposure to the substrate (101). The first radiofrequency power of operation 205 corresponds to a high radiofrequency power level. Also, during the operation 205, bias voltage is applied at the substrate holder (102) at a first bias voltage setting corresponding to a low bias voltage level.

In some embodiments, the first radiofrequency power corresponding to the high radiofrequency power level as applied in operation 205 is within a range extending from about 500 Watts (W) to about 6000 W. In some embodiments, the first radiofrequency power corresponding to the high radiofrequency power level as applied in operation 205 is within a range extending from about 1000 W to about 4000 W Also, in some embodiments, the first bias voltage setting corresponding to the low bias voltage level as applied in operation 205 is below a threshold voltage required for removal of a material from the substrate (101) through interaction of ions from the plasma (104) with the material on the substrate (101). More specifically, in some embodiments, the first bias voltage setting corresponding to the low bias voltage level as applied in operation 205 is set low enough that ions within the plasma (104) will not be able to gain a sufficient amount of kinetic energy in transit to the substrate (101) under the influence of the applied bias voltage so as to cause ion-induced sputtering of the material from the substrate (101). In some embodiments, the first bias voltage setting corresponding to the low bias voltage level as applied in operation 205 is a positive voltage above zero. In some embodiments, the first bias voltage setting corresponding to the low bias voltage level as applied in operation 205 is zero.

From the operation 205, the method continues with an operation 207 in which, for a second period of time greater than the first period of time of operation 205, and after completion of the first period of time of operation 205, a second radiofrequency power is applied to the process gas composition within the plasma generation region (104A) to generate the plasma (104) in exposure to the substrate (101). It should be understood that in operation 207, the second radiofrequency power is applied instead of the first radiofrequency power as applied in operation 205. The second radiofrequency power of operation 207 corresponds to a low radiofrequency power level. Also, during the operation 207, bias voltage is applied at the substrate holder (102) at a second bias voltage setting corresponding to a high bias voltage level.

In some embodiments, the second radiofrequency power corresponding to the low radiofrequency power level as applied in operation 207 is within a range extending from about 20 W to about 1000 W. In some embodiments, the second radiofrequency power corresponding to the low radiofrequency power level as applied in operation 207 is within a range extending from about 100 W to about 600 W. Also, in some embodiments, the second bias voltage setting corresponding to the high bias voltage level as applied in operation 207 is within a range extending up to about 5000 V. In some embodiments, the second bias voltage setting corresponding to the high bias voltage level as applied in operation 207 is within a range extending up to about 3000 V. In some embodiments, the second bias voltage setting corresponding to the high bias voltage level as applied in operation 207 is within a range extending from about 100 V to about 5000 V. In some embodiments, the second bias voltage setting corresponding to the high bias voltage level as applied in operation 207 is within a range extending from about 200 V to about 3000 V.

From the operation 207, the method reverts back to the operation 205, as indicated by arrow 209, to again apply the first RF power corresponding to the high RF power level to generate the plasma (104) while also applying the bias voltage to the substrate holder (102) at the first bias voltage setting corresponding to the low bias voltage level. In this manner, operations 205 and 207 are repeated in an alternating and successive manner for an overall period of time necessary to produce a desired effect on the substrate (101). As indicated by arrows 211 directed to a termination operation 213, plasma processing of the substrate (101) in accordance with the method can be terminated at any time, either during operation 205, or at the end of operation 205, or during operation 207, or at the end of operation 207, when a desired effect has been achieved on the substrate (101).

The plasma (104) generated in both the operation 205 and the operation 207 is generated such that a mean-lifetime of radicals with the plasma (104) is about three orders of magnitude greater than a mean-lifetime of ions within the plasma (104). Therefore, by having a duration of the first period of time of operation 205 that is shorter than a duration of the second period of time of operation 207, a time-averaged ion density within the plasma (104) is greater than a time-averaged radical density within the plasma (104). In some embodiments, the duration of the first period of time of operation 205 is within a range extending from about 0.001 millisecond (ms) to about 1 ms, and the duration of the second period of time of operation 207 is within a range extending from about 0.009 ms to about 100 ms. In some embodiments, a sum of the duration of the first period of time operation 205 and the duration of the second period of time operation 207 is within a range extending from about 0.01 ms to about 100 ms. In some embodiments, the duration of the first period of time of operation 205 is less than or equal to about ten percent of the sum of the duration of the first period of time operation 205 and the duration of the second period of time operation 207.

Figure 2B:
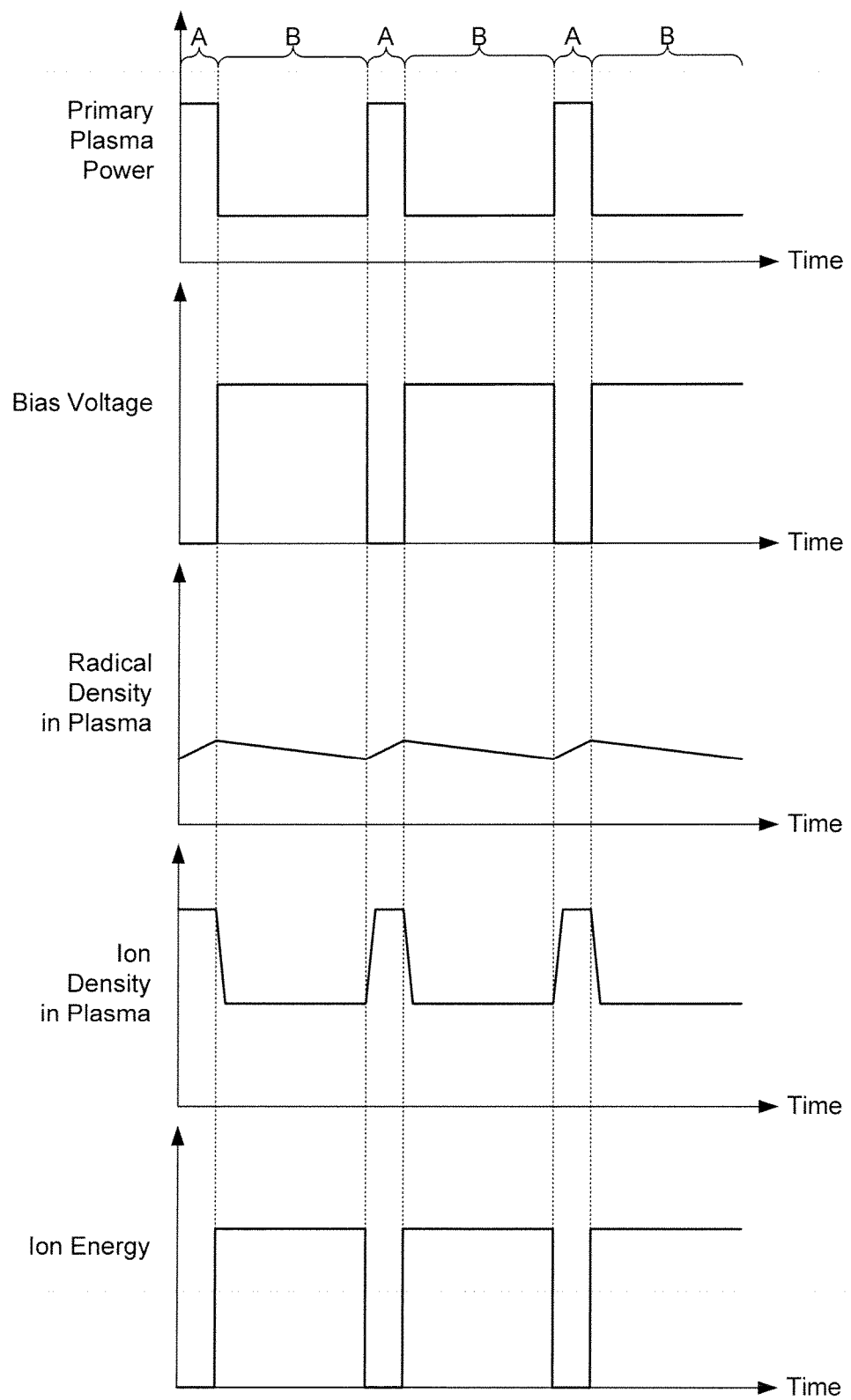
FIG. 2B shows example synchronized plots of applied primary plasma power, applied bias voltage, radical density in the plasma, ion density in the plasma, and ion energy incident upon the substrate to demonstrate the method of FIG. 2A over time, in accordance with some embodiments of the present invention.

FIG. 2B shows example synchronized plots of applied primary plasma power, applied bias voltage, radical density in the plasma (104), ion density in the plasma (104), and ion energy incident upon the substrate (101) to demonstrate the method of FIG. 2A over time, in accordance with some embodiments of the present invention. The plot of primary plasma power shows how the RF power is applied to generate the plasma (104) in accordance with performing operations 205 and 207 in an alternating and successive manner as described with regard to FIG. 2A. Performance of the operation 205 corresponds to a process state A. And, performance of the operation 207 corresponds to a process state B. FIG. 2B shows that in process state A (operation 205), the primary plasma power is applied at a high RF power level, while the bias voltage is applied at a low/zero bias voltage level. Also, in process state B (operation 207), the primary plasma power is applied at a low RF power level, while the bias voltage is applied at a high bias voltage level.

Because the ions in the plasma (104) need the bias voltage to be high/on in order to gain enough energy to affect change on the substrate (101), the effective ion density of the plasma (104) is directly correlated to the time consumed by process step B (operation 207). As shown in FIG. 2B, the duration of process state A (operation 205) is less than the duration of process step B (operation 207). Therefore, on a time-averaged basis, the bias voltage is high/on in process step B (operation 207) longer than the bias voltage is low/off in process step A (operation 205). And, consequently, the effective ion density in the plasma (104) for causing ion-induced reactions on the substrate (101) in the method of FIG. 2A is increased.

Additionally, because radical generation in the plasma (104) is directly correlated to the applied primary plasma power, and because the mean-lifetime of radicals in the plasma (104) is about three orders of magnitude larger than the mean-lifetime of ions in the plasma (104), the longer duration of process step B (operation 207) relative to process step A (205) provides generation of a lower time-averaged radical density within the plasma (104) in a sustained and stable manner. Therefore, from a time-averaged perspective, the method of FIG. 2A as exemplified in the plots of FIG. 2B provide for controlling the plasma (104) to have an increased ion density and a decreased radical density.

Figure 3A:
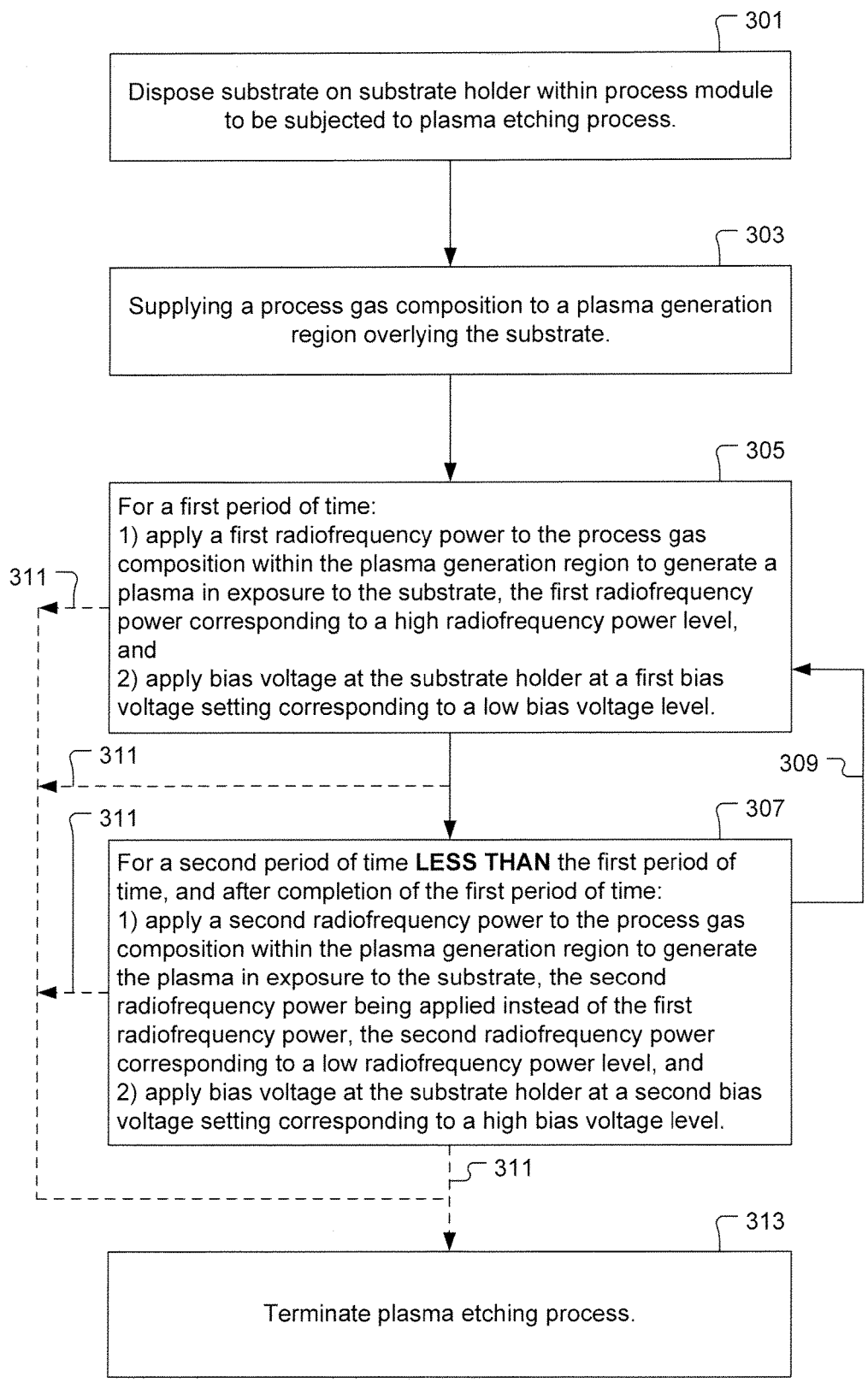
FIG. 3A shows a flowchart for a method for controlling a plasma in a semiconductor fabrication process to have a decreased ion density and an increased radical density, in accordance with some embodiments of the present invention.

FIG. 3A shows a flowchart for a method for controlling a plasma in a semiconductor fabrication process to have a decreased ion density and an increased radical density, in accordance with some embodiments of the present invention. The method includes an operation 301 for disposing a substrate (101) on a substrate holder (102) within a process module (100). The method also includes an operation 303 for supplying a process gas composition to a plasma generation region (104A) overlying the substrate (101). The method also includes an operation 305 in which, for a first period of time, a first radiofrequency power is applied to the process gas composition within the plasma generation region (104A) to generate a plasma (104) in exposure to the substrate (101). The first radiofrequency power of operation 305 corresponds to a high radiofrequency power level. Also, during the operation 305, bias voltage is applied at the substrate holder (102) at a first bias voltage setting corresponding to a low bias voltage level.

In some embodiments, the first radiofrequency power corresponding to the high radiofrequency power level as applied in operation 305 is within a range extending from about 500 W to about 6000 W. In some embodiments, the first radiofrequency power corresponding to the high radiofrequency power level as applied in operation 305 is within a range extending from about 1000 W to about 4000 W. Also, in some embodiments, the first bias voltage setting corresponding to the low bias voltage level as applied in operation 305 is below a threshold voltage required for removal of a material from the substrate (101) through interaction of ions from the plasma (104) with the material on the substrate (101). More specifically, in some embodiments, the first bias voltage setting corresponding to the low bias voltage level as applied in operation 305 is set low enough such that ions within the plasma (104) will not be able to gain a sufficient amount of kinetic energy in transit to the substrate (101) under the influence of the applied bias voltage to cause ion-induced sputtering of the material from the substrate (101). In some embodiments, the first bias voltage setting corresponding to the low bias voltage level as applied in operation 305 is a positive voltage above zero. In some embodiments, the first bias voltage setting corresponding to the low bias voltage level as applied in operation 305 is zero.

From the operation 305, the method continues with an operation 307 in which, for a second period of time less than the first period of time of operation 305, and after completion of the first period of time of operation 305, a second radiofrequency power is applied to the process gas composition within the plasma generation region (104A) to generate the plasma (104) in exposure to the substrate (101). It should be understood that in operation 307, the second radiofrequency power is applied instead of the first radiofrequency power as applied in operation 305. The second radiofrequency power of operation 307 corresponds to a low radiofrequency power level. Also, during the operation 307, bias voltage is applied at the substrate holder (102) at a second bias voltage setting corresponding to a high bias voltage level.

In some embodiments, the second radiofrequency power corresponding to the low radiofrequency power level as applied in operation 307 is within a range extending from about 20 W to about 1000 W. In some embodiments, the second radiofrequency power corresponding to the low radiofrequency power level as applied in operation 307 is within a range extending from about 100 W to about 600 W. Also, in some embodiments, the second bias voltage setting corresponding to the high bias voltage level as applied in operation 307 is within a range extending up to about 5000 V. In some embodiments, the second bias voltage setting corresponding to the high bias voltage level as applied in operation 307 is within a range extending up to about 3000 V. In some embodiments, the second bias voltage setting corresponding to the high bias voltage level as applied in operation 307 is within a range extending from about 100 V to about 5000 V. In some embodiments, the second bias voltage setting corresponding to the high bias voltage level as applied in operation 307 is within a range extending from about 200 V to about 3000 V.

From the operation 307, the method reverts back to the operation 305, as indicated by arrow 309, to again apply the first RF power corresponding to the high RF power level to generate the plasma (104) while also applying the bias voltage to the substrate holder (102) at the first bias voltage setting corresponding to the low bias voltage level. In this manner, operations 305 and 307 are repeated in an alternating and successive manner for an overall period of time necessary to produce a desired effect on the substrate (101). As indicated by arrows 311 directed to a termination operation 313, plasma processing of the substrate (101) in accordance with the method can be terminated at any time, either during operation 305, or at the end of operation 305, or during operation 307, or at the end of operation 307, when a desired effect has been achieved on the substrate (101).

The plasma (104) generated in both the operation 305 and the operation 307 is generated such that a mean-lifetime of radicals with the plasma (104) is about three orders of magnitude greater than a mean-lifetime of ions within the plasma (104). Therefore, by having a duration of the first period of time of operation 305 that is longer than a duration of the second period of time of operation 307, a time-averaged ion density within the plasma (104) is less than a time-averaged radical density within the plasma (104). In some embodiments, the duration of the first period of time of operation 305 is within a range extending from about 0.009 ms to about 100 ms, and the duration of the second period of time of operation 307 is within a range extending from about 0.001 ms to about 1 ms. In some embodiments, a sum of the duration of the first period of time operation 305 and the duration of the second period of time operation 307 is within a range extending from about 0.01 ms to about 100 ms. In some embodiments, the duration of the second period of time of operation 307 is less than or equal to about ten percent of the sum of the duration of the first period of time operation 305 and the duration of the second period of time operation 307.

Figure 3B:
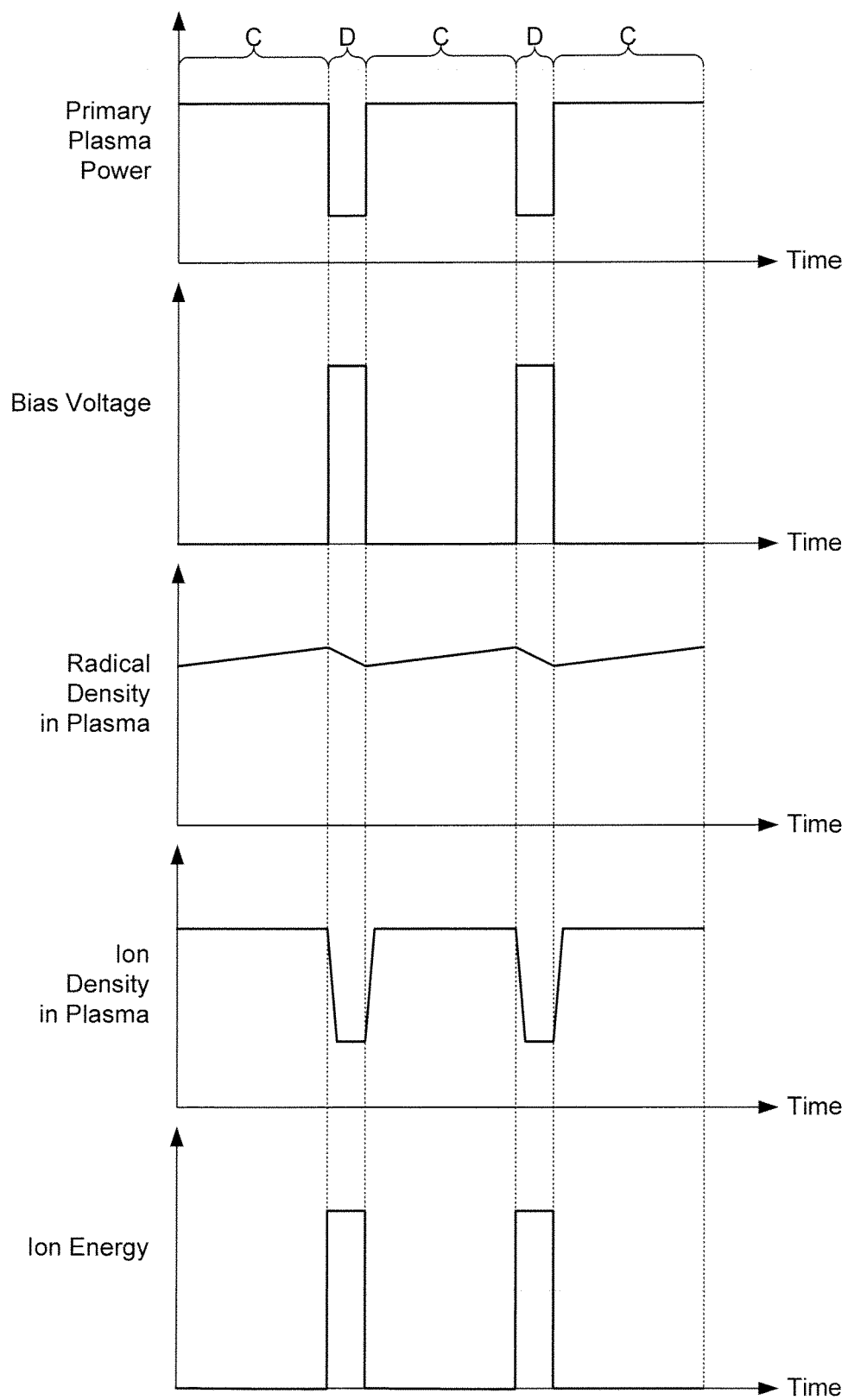
FIG. 3B shows example synchronized plots of applied primary plasma power, applied bias voltage, radical density in the plasma, ion density in the plasma, and ion energy incident upon the substrate to demonstrate the method of FIG. 3A over time, in accordance with some embodiments of the present invention.

FIG. 3B shows example synchronized plots of applied primary plasma power, applied bias voltage, radical density in the plasma (104), ion density in the plasma (104), and ion energy incident upon the substrate (101) to demonstrate the method of FIG. 3A over time, in accordance with some embodiments of the present invention. The plot of primary plasma power shows how the RF power is applied to generate the plasma (104) in accordance with performing operations 305 and 307 in an alternating and successive manner as described with regard to FIG. 3A. Performance of the operation 305 corresponds to a process state C. And, performance of the operation 307 corresponds to a process state D. FIG. 3B shows that in process state C (operation 305), the primary plasma power is applied at a high RF power level, while the bias voltage is applied at a low/zero bias voltage level. Also, in process state D (operation 307), the primary plasma power is applied at a low RF power level, while the bias voltage is applied at a high bias voltage level.

Because the ions in the plasma (104) need the bias voltage to be high/on in order to gain enough energy to affect change on the substrate (101), the effective ion density of the plasma (104) is directly correlated to the time consumed by process step D (operation 307). As shown in FIG. 3B, the duration of process state D (operation 307) is less than the duration of process step C (operation 305). Therefore, on a time-averaged basis, the bias voltage is high/on in process step D (operation 307) less than the bias voltage is low/off in process step C (operation 305). And, consequently, the effective ion density in the plasma (104) for causing ion-induced reactions on the substrate (101) in the method of FIG. 3A is decreased.

Additionally, because radical generation in the plasma (104) is directly correlated to the applied primary plasma power, and because the mean-lifetime of radicals in the plasma (104) is about three orders of magnitude larger than the mean-lifetime of ions in the plasma (104), the longer duration of process step C (operation 305) relative to process step D (307) provides generation of a higher time-averaged radical density within the plasma (104) in a sustained and stable manner. Therefore, from a time-averaged perspective, the method of FIG. 3A as exemplified in the plots of FIG. 3B provide for controlling the plasma (104) to have a decreased ion density and an increased radical density.

As discussed above with regard to the methods of FIGS. 2A and 3A, both the primary plasma power and the bias voltage are pulsed/cycled in a reverse synchronized manner at the same frequency. The primary plasma power (i.e., RF power applied to generate the plasma) defines both the radical density within the plasma and the ion density within the plasma, as they are coupled, and the applied bias voltage controls ion energy such that the effectiveness of the ion density is essentially restricted to when the bias voltage is applied/high/on. A single pulse/cycle of the primary plasma power corresponds to the combination of the first period of time when the primary plasma power is high/on (operations 205 and 305 in the methods of FIGS. 2A and 3A, respectively) and the second period of time when the primary plasma power is low/off (operations 207 and 307 in the methods of FIGS. 2A and 3A, respectively). In some embodiments, the primary plasma power is pulsed/cycled with a cycle frequency up to about 100 kHz. In some embodiments, the primary plasma power is pulsed/cycled with a cycle frequency within a range extending from about 0.1 kHz to about 10 kHz. The pulse/cycle frequency of the primary plasma power and the duration of the high primary plasma power relative to the low primary plasma power in a given pulse/cycle of the pulsed primary plasma power are controlled to obtain a desired ratio of radical density to effective ion density within the plasma.

When the higher primary plasma power is applied in a given pulse/cycle of the pulsed primary plasma power, the radical density is high and the ion density is high, but the ion energy is essentially zero to the lack of bias voltage. When the lower primary plasma power is applied in a given pulse/cycle of the pulsed primary plasma power, the radical density is low and the ion density is low, and the ion energy has a positive level corresponding to the applied bias voltage. As the pulse/cycle frequency of the pulsed primary plasma power is increased to an operational range, e.g., about 0.1 kHz to about 10 kHz, the difference between the mean-lifetime of ions within the plasma (on the order of microseconds) and the mean-lifetime of radicals within the plasma (on the order of seconds) provides for a plasma processing regime in which ion density within the plasma drops in accordance with pulsing/cycling of the primary plasma power, but the radical density within the plasma cannot follow the pulsing/cycling of the primary plasma power. In this plasma processing regime, the time-averaged radical density will be almost constant in all plasma states during pulsing/cycling of the primary plasma power, with relatively small fluctuation of the radical density about the time-averaged radical density in accordance with the pulse/cycle frequency of the pulsed primary plasma power. Therefore, the time-averaged radical density is controlled by the time-averaged primary plasma power.

When ions are needed during plasma processing, the bias voltage is turned on to increase the ion energy to a level at which the ions can obtain enough kinetic energy to induce ion-interactions on the substrate. The combination of the applied primary plasma power and the applied bias voltage when the bias voltage is on provides an independent control of the effective ion density within the plasma, wherein the effective ion density represents the number of ions available for actually inducing reactions with material on the substrate. In this manner, when a given pulse/cycle of the pulsed plasma power has a longer duration of higher primary plasma power in conjunction with zero bias voltage relative to a shorter duration of lower primary plasma power in conjunction with high bias voltage, the effective ion density within the plasma is lower than what it would be if a continuous wave primary plasma power were applied. Correspondingly, when a given cycle of the pulsed plasma power has a shorter duration of higher primary plasma power in conjunction with zero bias voltage relative to a longer duration of lower primary plasma power in conjunction with high bias voltage, the effective ion density within the plasma is higher than what it would be if a continuous wave primary plasma power were applied.

The methods and systems disclosed herein for independently controlling radical density, ion density, and ion energy during plasma etching of a substrate provide numerous benefits due to the decoupling of radical density and effective ion density within the plasma, including improvement in etching selectivity of a target material relative to a mask material, improvement in feature profile control, and improvement in controlling aspect-ratio-dependent-etch issues, among others. It should be appreciated that with the high-frequency reverse synchronized pulsing/cycling of the primary plasma power and bias voltage as provided in the methods disclosed herein, it is possible to obtain a plasma process window having independently controlled radical density, ion density and ion energy. For decoupling of radical density and ion density, the pulse/cycle frequency of the pulsed primary plasma power is set to allow ion density decay while maintaining a prescribed level of radical density. The independent control of radical density, ion density, and ion energy provided by the methods disclosed herein serves to mitigate the trade-offs between feature profile control, etching selectivity, and overall fabrication throughput that exist with conventional plasma processing methods. Also, it should be understood that the methods disclosed herein can be utilized with existing and/or new process gas composition chemistries, thereby extending the plasma processing capabilities available with use existing process gas compositions and providing for development of new plasma processing capabilities with use of new process gas compositions.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the described embodiments.

What is claimed is:

1. A method for controlling a plasma in a semiconductor fabrication process, comprising:
    (a) disposing a substrate on a substrate holder within a process module;
    (b) supplying a process gas composition to a plasma generation region overlying the substrate;
    (c) for a first period of time, applying a first radiofrequency power to the process gas composition within the plasma generation region to generate a plasma in exposure to the substrate, the first radiofrequency power corresponding to a high radiofrequency power level, and applying bias voltage at the substrate holder at a first bias voltage setting corresponding to a low bias voltage level that is below a threshold voltage required for removal of a material from the substrate through interaction of ions from the plasma with the material on the substrate;
    (d) for a second period of time, after completion of the first period of time, applying a second radiofrequency power to the process gas composition within the plasma generation region to generate the plasma in exposure to the substrate, wherein the second radiofrequency power is applied instead of the first radiofrequency power, the second radiofrequency power corresponding to a low radiofrequency power level, and applying bias voltage at the substrate holder at a second bias voltage setting corresponding to a high bias voltage level; and
    (e) repeating operations (c) and (d) in an alternating and successive manner for an overall period of time necessary to produce a desired effect on the substrate,
    wherein a duration of the first period of time of operation (c) is shorter than a duration of the second period of time of operation (d) such that a time-averaged ion density within the plasma is greater than a time-averaged radical density within the plasma.

2. The method as recited in claim 1, wherein the first radiofrequency power corresponding to the high radiofrequency power level is within a range extending from about 500 Watts to about 6000 Watts, or within a range extending from about 1000 W to about 4000 W.

3. The method as recited in claim 1, wherein the second radiofrequency power corresponding to the low radiofrequency power level is within a range extending from about 20 Watts to about 1000 Watts, or within a range extending from about 100 Watts to about 600 Watts.

4. The method as recited in claim 1, wherein the first bias voltage setting corresponding to the low bias voltage level is zero.

5. The method as recited in claim 1, wherein the second bias voltage setting corresponding to the high bias voltage level is within a range extending up to about 5000 volts, or within a range extending up to about 3000 volts, or within a range extending from about 100 volts to about 5000 volts, or within a range extending from about 200 volts to about 3000 volts.

6. The method as recited in claim 1, wherein the duration of the first period of time of operation (c) is within a range extending from about 0.001 millisecond to about 1 millisecond, and wherein the duration of the second period of time of operation (d) is within a range extending from about 0.009 millisecond to about 100 milliseconds.

7. The method as recited in claim 1, wherein a sum of the duration of the first period of time operation (c) and the duration of the second period of time operation (d) is within a range extending from about 0.01 milliseconds to about 100 milliseconds.

8. The method as recited in claim 7, wherein the duration of the first period of time of operation (c) is less than or equal to about ten percent of the sum of the duration of the first period of time operation (c) and the duration of the second period of time operation (d).

9. The method as recited in claim 1, wherein the plasma is generated such that a mean-lifetime of radicals with the plasma is about three orders of magnitude greater than a mean-lifetime of ions within the plasma.

10. A method for controlling a plasma in a semiconductor fabrication process, comprising:
   (a) disposing a substrate on a substrate holder within a process module;
   (b) supplying a process gas composition to a plasma generation region overlying the substrate;
   (c) for a first period of time, applying a first radiofrequency power to the process gas composition within the plasma generation region to generate a plasma in exposure to the substrate, the first radiofrequency power corresponding to a high radiofrequency power level, and applying bias voltage at the substrate holder at a first bias voltage setting corresponding to a low bias voltage level that is below a threshold voltage required for removal of a material from the substrate through interaction of ions from the plasma with the material on the substrate;
   (d) for a second period of time, after completion of the first period of time, applying a second radiofrequency power to the process gas composition within the plasma generation region to generate the plasma in exposure to the substrate, wherein the second radiofrequency power is applied instead of the first radiofrequency power, the second radiofrequency power corresponding to a low radiofrequency power level, and applying bias voltage at the substrate holder at a second bias voltage setting corresponding to a high bias voltage level; and
   (e) repeating operations (c) and (d) in an alternating and successive manner for an overall period of time necessary to produce a desired effect on the substrate,
   wherein a duration of the first period of time of operation (c) is greater than a duration of the second period of time of operation (d) such that a time-averaged ion density within the plasma is less than a time-averaged radical density within the plasma.

11. The method as recited in claim 10, wherein the first radiofrequency power corresponding to the high radiofrequency power level is within a range extending from about 500 Watts to about 6000 Watts, or within a range extending from about 1000 W to about 4000 W.

12. The method as recited in claim 10, wherein the second radiofrequency power corresponding to the low radiofrequency power level is within a range extending from about 20 Watts to about 1000 Watts, or within a range extending from about 100 Watts to about 600 Watts.

13. The method as recited in claim 10, wherein the first bias voltage setting corresponding to the low bias voltage level is zero.

14. The method as recited in claim 10, wherein the second bias voltage setting corresponding to the high bias voltage level is within a range extending up to about 5000 volts, or within a range extending up to about 3000 volts, or within a range extending from about 100 volts to about 5000 volts, or within a range extending from about 200 volts to about 3000 volts.

15. The method as recited in claim 10, wherein the duration of the first period of time of operation (c) is within a range extending from about 0.009 millisecond to about 100 milliseconds, and wherein the duration of the second period of time of operation (d) is within a range extending from about 0.001 millisecond to about 1 millisecond.

16. The method as recited in claim 10, wherein a sum of the duration of the first period of time of operation (c) and the duration of the second period of time of operation (d) is within a range extending from about 0.01 milliseconds to about 100 milliseconds.

17. The method as recited in claim 16, wherein the duration of the second period of time of operation (d) is less than or equal to about ten percent of the sum of the duration of the first period of time of operation (c) and the duration of the second period of time of operation (d).

18. The method as recited in claim 10, wherein the plasma is generated such that a mean-lifetime of radicals with the plasma is about three orders of magnitude greater than a mean-lifetime of ions within the plasma.

* * * * *